(12) United States Patent
Ginetti

(10) Patent No.: US 6,378,116 B1
(45) Date of Patent: Apr. 23, 2002

(54) USING BUDGETED REQUIRED TIME DURING TECHNOLOGY MAPPING

(75) Inventor: Arnold Ginetti, Antibe (FR)

(73) Assignee: Cadence Design Systems, Inc., San Jose, CA (US)

(\*) Notice: Subject to any disclaimer, the term of this patent is extended or adjusted under 35 U.S.C. 154(b) by 0 days.

(21) Appl. No.: 09/322,696

(22) Filed: May 28, 1999

(51) Int. Cl.[7] .............................................. G06F 17/50

(52) U.S. Cl. ........................ 716/7; 716/3; 716/2; 716/6

(58) Field of Search ........................................ 716/1–21

(56) References Cited

U.S. PATENT DOCUMENTS

| | | | |
|---|---|---|---|
| 5,349,659 A | | 9/1994 | Do et al. ........................ 707/7 |
| 5,513,124 A | | 4/1996 | Trimberger et al. ............ 716/7 |
| 5,526,276 A | | 6/1996 | Cox et al. ...................... 716/17 |
| 5,537,330 A | | 7/1996 | Damiano et al. .............. 716/18 |
| 5,553,000 A | * | 9/1996 | Dey et al. ...................... 716/6 |
| 5,682,320 A | * | 10/1997 | Khouja et al. .................. 716/4 |
| 5,754,454 A | * | 5/1998 | Pixley et al. ................ 702/123 |
| 5,774,369 A | * | 6/1998 | Horstmann et al. ............. 716/2 |
| 5,787,010 A | | 7/1998 | Schaefer et al. ................ 716/7 |
| 5,805,462 A | * | 9/1998 | Poirot et al. .................... 716/18 |
| 5,815,406 A | | 9/1998 | Golla et al. ...................... 716/7 |
| 5,838,585 A | * | 11/1998 | Scepanovic et al. .......... 716/12 |
| 5,856,926 A | | 1/1999 | Matsumoto et al. .......... 716/18 |
| 5,974,242 A | * | 10/1999 | Damarla et al. ................ 716/2 |
| 6,154,874 A | * | 11/2000 | Scepanovic et al. .......... 716/13 |
| 6,195,788 B1 | * | 2/2001 | Leaver et al. .................. 716/18 |

OTHER PUBLICATIONS

Youssef et al. ("Bounds on Net Delays for VLSI Circuits", IEEE Transactions on Circuits and Systems II: Analog and Digital Signal Processing, vol. 39, No. 11, Nov. 1992, pp. 815–824).*

Stroud et al. ("Behavioral model synthesis with cones", IEEE Design & Test of Computers, vol. 5, No. 3, Jun. 1988, pp. 22–30).*

Pan et al. ("Structural analysis of large digital circuits", Proceedings of Pacific Rim International Symposium on Fault Tolerant Systems, Sep. 26, 1991, pp. 128–133).*

Brasen et al. ("Using cone structures for circuit partitioning into FPGA packages", IEEE Transactions on Computer–Aided Design of Integrated Circuits and Systems, vol. 17, No. 7, Jul. 1998, pp. 592–600).*

Tsay et al. ("A row–based cell placement method that utilizes circuit structural properties", IEEE Transactions on Computer–Aided Design of Integrated Circuits and Systems, vol. 14, No. 3, pp. 393–397, Mar. 1995).*

Sawada et al. ("Restructuring logic representations with easily detectable simple disjunctive decompositions", Proceedings of Design, Automation and Test in Europe, Feb. 23, 1998, pp. 755–759).*

Van der Linden ("Circuit partitioned automatic test pattern generation constrained by three–state buses and restrictors", Proceedings of the Fifth Asian Test Symposium, Nov. 20, 1996, pp. 29–33).*

(List continued on next page.)

Primary Examiner—Matthew Smith
Assistant Examiner—Phallaka Kik
(74) Attorney, Agent, or Firm—Lyon & Lyon LLP

(57) ABSTRACT

A method for selecting which covers to retain for each node reduces the computational burden for large logic cones and large cell libraries. At each node only K covers are retained. These covers have timing performances which are centered around the ideal timing performance for that node, and do not include inferior covers. The computational burden in selecting the covers for each node is based on the number K, and the number of inputs to that node.

22 Claims, 5 Drawing Sheets

OTHER PUBLICATIONS

Cong et al. ("Exploiting signal flow and logic dependency in standard cell placement", Proceedings of the ASP–DAC '95/CHDL '95/VLSI '95, IFIP International Conference on Hardware Description Languages, Aug. 29, 1995, pp. 399–404).*

Chen, Chau–Shen et al., "Combining Technology Mapping and Placement For Delay–Minimization In FPGA Designs", *IEEE Transactions* On Computer–Aided Design Of Integrated Circuits And Systems, vol. 14, No. 9, Sep. 1995, pp. 1076–1084.

Pedram, Massoud et al, "Layout Driven Logic Restructuring/Decomposition", *IEEE Transactions*, pp. 134–137, Jan. 1991.

Chen, Chau–Shen et al., "Combining Technology Mapping And Placement For Delay–Optimization In FPGA Designs"; *IEEE Transactions*, pp. 123–127, Jan. 1993.

Lou, Jinan et al., "An Integrated Florw For Technology Remapping And Placement Of Sub–Half–Micron Circuits", *IEEE Transactions*, pp. 295–300, Jan. 1998.

Pedram, Massoud et al., "Layout Driven Technology Mapping", $28^{th}$ ACM/IEEE Design Automation Conference, Jun. 17–21 1991, San Francisco, California, pp. 99–105.

* cited by examiner

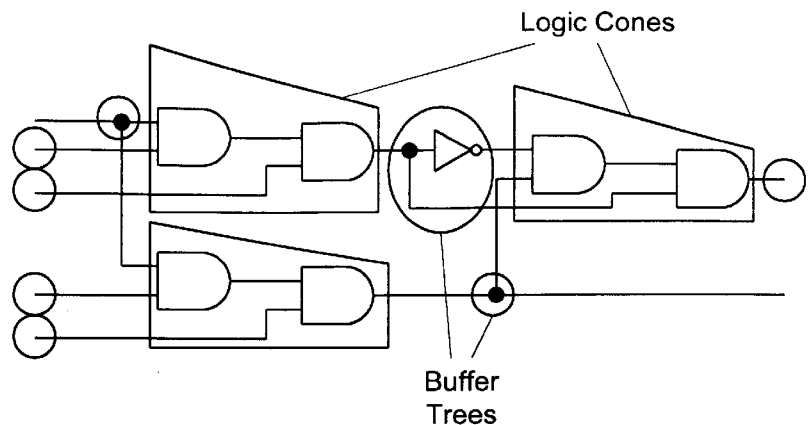

Fig. 1

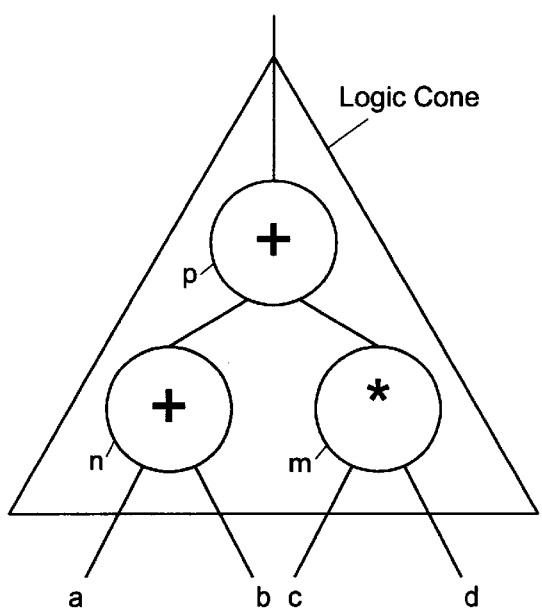

Fig. 2a match1: gate: 2-input OR
output polarity: direct
gate output: o
child nodes: a b
child node polarity: direct direct
gate inputs: i1 i2 match2: gate: 2-input AND
output polarity: invert
gate output: o
child nodes: a b
child node polarity: invert invert
gate inputs: i1 i2 match3: gate: dual 2-input OR
output polarity: direct invert
gate output: o ob
child nodes: a b
child node polarity: direct direct
gate inputs: i1 i2

Fig. 2b cover1: gate: 2-input OR
    polarity: direct
    child cover: a b
    polarities: direct direct
    area: 5
    slack: 0 cover2: gate: 2-input NAND
    polarity: direct
    child cover: a b
    polarities: invert invert
    area: 3
    slack: -.1 cover1: gate: 2-input AND
    polarity: direct
    child cover: c d
    polarities: direct direct
    area: 5
    slack: -.1 cover2: gate: 2-input NOR
    polarity: direct
    child cover: c d
    polarities: invert invert
    area: 3
    slack: -.2

USING BUDGETED REQUIRED TIME DURING TECHNOLOGY MAPPING

CROSS-REFERENCE TO RELATED APPLICATION

This application is related to commonly assigned U.S. patent application Ser. No. 09/322,262 for "Updating Placement During Technology Mapping", filed on the same day as the present application. The disclosure of the related application is incorporated herein by reference.

FIELD OF INVENTION

This invention pertains to the field of electronic design automation. More specifically, this invention pertains to the operation of a technology mapping tool.

BACKGROUND OF THE INVENTION

Modern logic circuits are so complex that designers generally require computer-based techniques to aid in their design. During the design of a complex logic circuit, a process called "Technology Mapping" is employed to transform an abstract representation of a design into a technology-dependent netlist, which is a representation of the design using cells of a technology-specific target library. The abstract representation of the design is generally made up of combinatorial blocks separated by sequential blocks. A combinatorial block represents a multiple-input Boolean equation in which the output is a logical combination of the input signals, and is often described by Directed Acyclic Graphs (DAGs). A sequential block is one that maintains a state representation, so that the outputs are not simply a logical combination of the inputs.

The technology mapping can be carried out in a series of steps. In a first step, the technology mapper partitions a DAG into a set of interconnected logic cones and buffer trees. A logic cone is a set of fanout free interconnected 2-input AND nodes and 2-input OR nodes delimited by multi-fanout nodes, inverters, and buffers. A buffer tree is a set of interconnected inverters and buffers (sometimes reduced to a simple multi-fanout wire) delimited by 2-input AND nodes, 2-input OR nodes, and by DAG terminals. In FIG. 1, a DAG is illustrated as having been partitioned into three logic cones and eight buffer trees. After the DAG has been partitioned, the logic cones and the buffer trees are sorted in a forward Breadth First Search (BFS) order.

The logic cones are tiled one by one, according to the BFS sorted order. During the tiling step, the inputs of each logic cone are assumed to be available both in direct and inverted form. Also, the tiling is attempted for each logic cone in both direct and inverted form, with the best tiling being kept. At each node of a logic cone, the technology mapper iterates through all of the available library cells to determine whether each cell can cover the current node. This involves determining whether a covering is possible in either direct or inverted form. If so, a correspondence is established between the current cell input terminals and the input nodes driving that cell. The polarity of the terminals is defined as well. When the technology mapper reaches the root node of a logic cone (whose output is the logic cone output), it determines the best cover for the whole logic cone. That selection induces a polarity on the logic cone, as well as on all the logic cone input terminals.

The buffer trees are then buffered one by one, based on: (i) the initial polarity of the logic cone input terminals driven by the buffer tree, (ii) the tiler-produced polarity of the logic cone input terminals driven by the buffer tree, and (iii) the tiler-produced polarity of the logic cone output terminals driving the buffer tree. The results of the tiling and buffering replace the abstract representation of the combinatorial block in the design.

In the tiling step above, the technology mapper visits nodes within a logic cone in a BFS order from the inputs to the output. At each visited node, in a first phase, the technology mapper invokes a matcher with a given matchable library cell. The matcher produces a list of matches, each of which is composed of the following information:

TABLE 1

| Contents of a Match |
| --- |
| the matched library cell |
| the polarity of the match of the appropriate node output connector |
| an identification of each of the child nodes reached by that cell |
| the correspondence between the child nodes and the gate input connectors |
| the polarity of each of the child nodes |

For example, in the case of FIG. 2a, the matcher invoked for node n would produce a match including information such as that presented in FIG. 2b. A child node is one which has an output connected to an input of the current node.

After the production of the list of matches is completed, potential node covers are determined. A node cover is recursively defined as a match plus one cover for each child node of the match. A node cover can be seen as one set of interconnected components which are necessary to cover the functionality of that node from the logic cone input terminals. A node cover includes the following information:

TABLE 2

| Contents of a Cover |
| --- |
| a match for the node |
| the performance of the node cover |
| the polarity of the node cover |
| node covers for each of the child nodes of the match |

As used herein, the performance of a cover includes the area of the cover and the slack of the cover. The slack of the cover is automatically deduced by comparing the covered node rising/falling arrival times with the covered node budgeted required times. In some cases the potential of creating physical problems (i.e. routing problems) is also included in performance. A logic cone root node cover may be called a logic cone cover, because the full cover of the logic cone is revealed by recursively visiting the child node covers of that cover.

The tiling process generates many potential covers and it is a difficult task to select the best of these. The task is difficult in part because covers are difficult to compare and to trim. For example, it is not clear whether a smaller and slower cover should be preferred to a bigger and faster cover. However, there does exist an inferiority relationship between some covers which allows for an easy comparison of these covers. A cover is considered to be inferior to another cover if it is worse (i.e. bigger, worse slack, more difficult to place and route) than the other cover in at least one aspect and is not better than the other cover in any other aspect. Inferior covers can generally be immediately rejected in the tiling process.

A child node cover is said to be Logic Design Rule (LDR) compatible with a node cover if the connection of the child cover to the node cover does not create any LDR violation.

Two covers are considered to be timing equivalent if the difference between their slacks is smaller than a certain threshold τ. The physical concept behind the τ parameter is the fact that below a certain threshold, the timing that is measured within a timing engine is not meaningful. Note that the direct impact of the τ parameter is that non-inferior covers can be considered as inferior. For instance, if cover a produces a slack τ/2 better than cover b and if cover b is smaller than cover a, then cover a will be considered inferior to cover b, and will be rejected. This rejection is meaningful up to a certain threshold, because selecting smaller cover will decrease the final size of the design and will thus decrease the average wiring capacitance of the design.

In a second phase, the technology mapper associates covers with the matches produced by the matcher and evaluates the performance of these covers. The performance of a cover which is exclusively driven by logic cone input terminals can be computed as follows:

the area is the area of the matched cell; and the slack is computed as the difference between the timing engine budgeted required time and the timing engine computed arrival time on the output node of the matched cell.

While producing the different covers, the technology mapper compares the performance of the covers, eliminating rejectable covers, such as covers which do not respect a Logic Design Rule, covers which cover gates placed very far away from each other, and inferior covers.

The performance of a cover which is not exclusively driven by logic cone input terminals is computed as follows:

the area is the sum of the matched cell area plus the areas of the cover child node covers; and the slack is computed as the difference between the timing engine budgeted required time and the timing engine computed arrival time on the output node of the matched cell.

Once the logic cone output node has been visited, and once the cover performance values are known, the technology mapper selects the most appropriate logic cone cover (the one which best respects the constraints) for that logic cone. This selection will imply the polarity of the logic cone output terminal. The child node covers are recursively found by visiting the cover child node covers. Those recursive visits will imply the logic cone input terminal polarity.

FIG. 3a illustrates a typical logic cone. Nodes n and m have already been tiled, and the direct covers are as shown in FIGS. 3b and 3c, respectively. In tiling node p the matcher produces a series of potential matches, one of those being a 2-input AND gate. The goal of the matcher is to find the covers which will result in the best performance for the current logic cone. One problem is that the performance of the logic cone is only known once it has been totally tiled. Therefore, the best cover for a given node can only be known after the logic cone has been tiled. For any intermediate node, the matcher must estimate the performance of all the possible covers, and store all the non-inferior covers. In the case illustrated in FIG. 3, the matcher would try cover1 (n) with cover1(m), cover1(n) with cover2(m), cover2(n) with cover1(m) and cover2(n) with cover2(m). In the general case, a large number of cover performances will have to be estimated for each node. Note also that cover performance estimation is itself a CPU-intensive process It consists primarily of placing a matched cell, estimating wiring capacitance, and estimating the timing of the cover. The location of the matched cell is necessary because the wiring capacitance is calculated from the wiring length between the matched cell and other matched cells. In order to estimate the wiring length, the location of the matched cells is required.

Conventionally, two methods have been used to estimate the placement of a matched cell from an initial global placement:

the Center of Mass of Covered Nodes method (CM-of-Covered method);

the Center of Mass of Fan method (CM-of-Fan method).

The CM-of-Covered method comprises placing a matched gate in the center of mass of the positions of the different basic gates covered by the matched cell. The CM-of-Fan method comprises placing the matched cell in the center of mass of the interconnections of the matched cell, so that the total wire length necessary to connect that matched cell is minimized. These methods are described in Pedram, Massoud, et al., "Layout Driven Technology Mapping", 28$^{th}$ ACM/IEEE Design Automation Conference, 1991, which is incorporated by reference herein in its entirety. One disadvantage of the CM-of-Covered method is that the placement of a matched cell is independent of the interconnections of the matched cell. A disadvantage of the CM-of-Fan method is that to minimize the length of the interconnections, the positions of the gates connected to the matched cell are necessary, but the position of the gate driven by the current matched cell is not yet known. Also, because several covers are kept for each child node, the position of the gates driving the current matched cell are not known.

Another problem with conventional methods is that a large number of potential covers must be maintained for each node in a logic cone. As the logic cone grows larger, the amount of cover information which must be stored grows as well. Each successive node performance calculation requires an increasing amount of computational resources. The complexity of conventional methods fails to scale well with increasing size of logic cones and cell libraries.

What is needed is a system and method for estimating the placement of a matched cell from a global placement which takes the interconnections of the matched cell into account, but which does not require information about the position of the cells connected to the matched cell. What is also needed is a system and method for selecting covers for each node which does not become computationally difficult as logic cone and cell library sizes grow large.

SUMMARY OF THE INVENTION

A system and method for estimating the position of a matched cell is presented which takes into account the interconnectivities of that cell, without relying on the location of cells connected to the matched cell. The new method is referred to as the Weighted Center of Mass of Covered method (in short, WCM-of-Covered method). In this method, weights are given to the various nodes which are part of the match. These weights are based on the number of connections between the nodes and child nodes of the match. The placement of the matched cell is based on the initial positions given to the nodes making up the match, and the weights calculated for those nodes.

A system and method for selecting which covers to retain for each node reduces the computational burden for large logic cones and large cell libraries. At each node only K covers are retained. These covers have timing performances which are centered around the ideal timing performance for that node, and do not include inferior covers. The computational burden in selecting the covers for each node is based on the number K, and the number of inputs to that node.

BRIEF DESCRIPTION OF THE DRAWINGS

FIG. 1 illustrates the partitioning of a DAG into logic cones and buffer trees.

FIGS. 2a and 2b illustrate the relationship between nodes of a logic cone and possible matches of those nodes.

DETAILED DESCRIPTION OF THE PREFERRED EMBODIMENTS

Figures 3A, 3B, 3C:
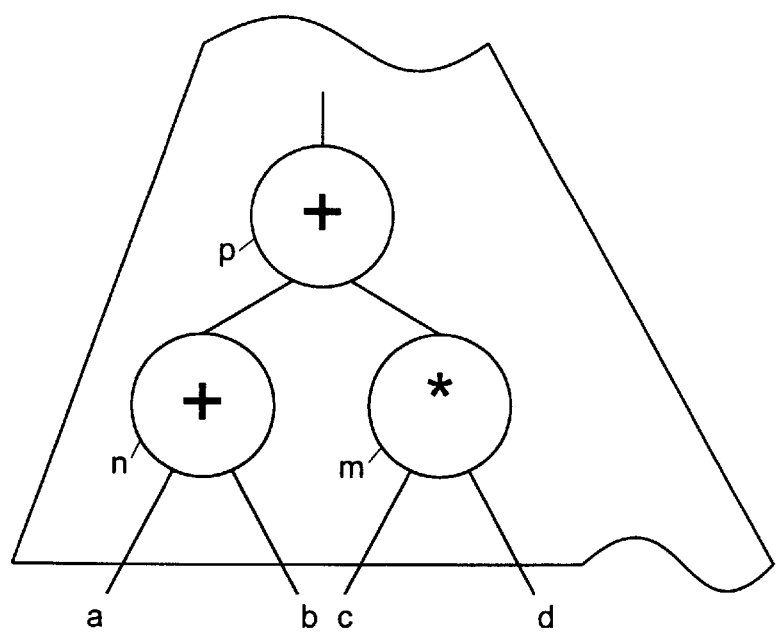
FIGS. 3a, 3b, and 3c illustrate the relationship between nodes of a logic cone and possible covers at those nodes.
Figure 4:
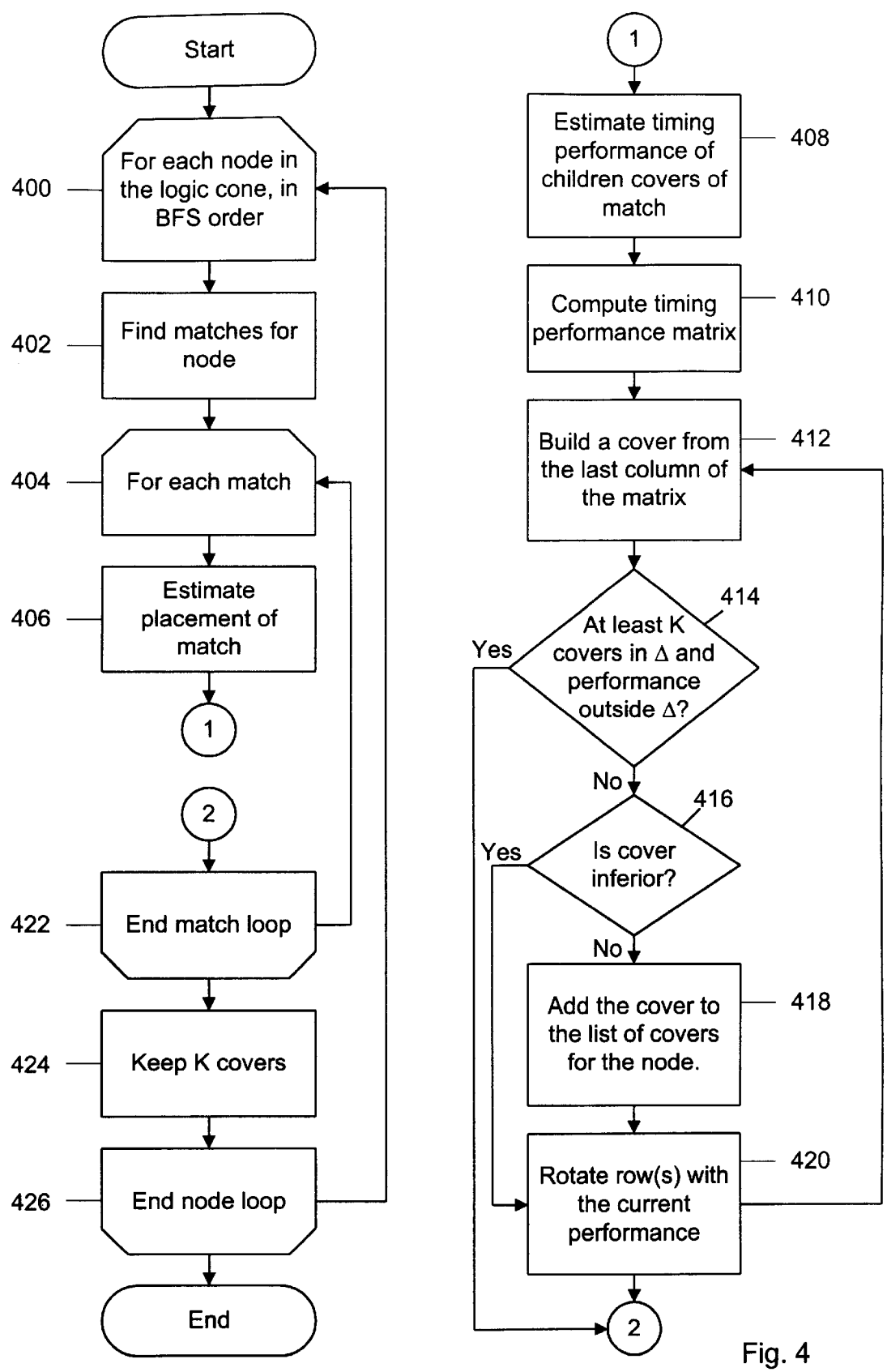
FIG. 4 illustrates a flowchart of the operation of one embodiment of the invention.

The input to a technology mapper is a decomposed netlist made up of (i) basic 2-input AND gates, (ii) basic 2-input OR gates, (iii) inverters, and (iv) sequential elements. Logic cones of this netlist are identified, and the technology mapper operates on each of these logic cones. In the illustrated embodiment, the netlist has been constructed in a timing-driven manner, so that no restructuring of the netlist is necessary. Referring now to FIG. 4, a flowchart illustrates the operation of a technology mapping according to one embodiment of the invention. The technology mapper loops 400 through each node of a logic cone, in BFS order. First, all input nodes are mapped, then each successive layer of nodes. The output node of the logic cone is mapped last. At each node, matches are found 402 from a library of matchable cells. Each cell of the library which can match the current node, in either direct or inverted form, is added to a list of potential matches for that node. Each match includes the functionality of the current node and zero or more child nodes of the current node. The information which makes up each match can include: the current node, the matched library cell, the polarity of the match of the appropriate node output connector, the child nodes reached by that match, the correspondence between the child nodes and the gate input connectors, and the polarity of each of the child nodes.

Figures 5, 8A, 8B:
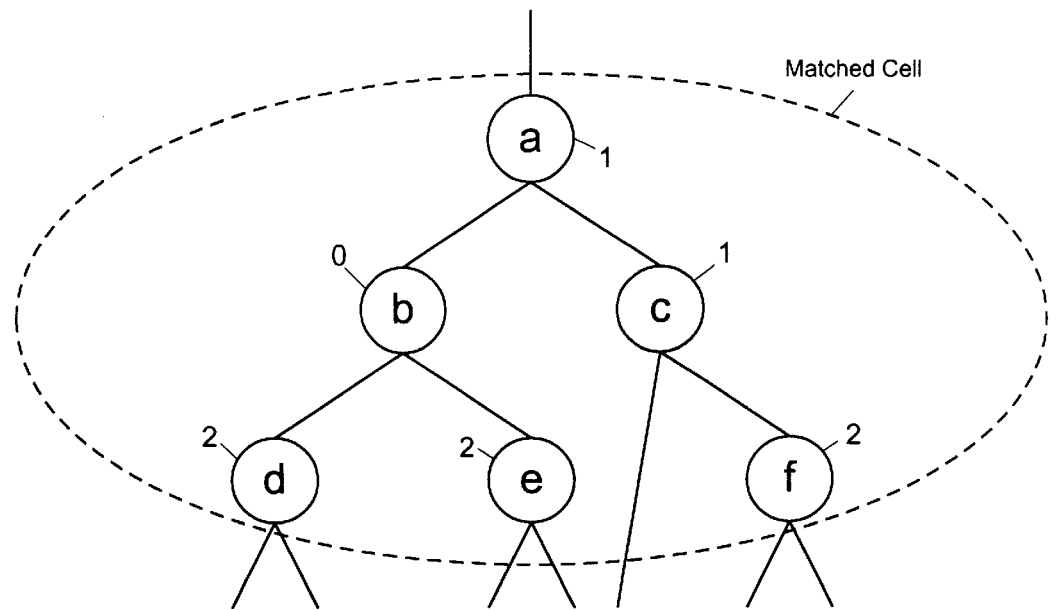
FIG. 5 illustrates the weights associated with nodes of a matched cell.
FIGS. 8a and 8b illustrate the timing performance matrix P.

The technology mapper then loops 404 through each of the potential matches for that node. For each match, the placement of the library cell corresponding to that match must be estimated 406. To do this, a matched cell is placed in the center of mass of the weighted positions of the different basic gates covered by the matched cell (the current node and child nodes covered by the match). As illustrated in FIG. 5, the weights are distributed to these nodes according to the number of connections from these nodes to nodes which are not part of the match. In the exemplary embodiment of the present invention, the weights are:

- 0 weight for a node which is not touching any node outside the matched cell (for instance the node b in FIG. 5);
- 1 weight for a node touching exactly one node outside the matched cell (for instance the nodes a and c in FIG. 5); and
- 2 weight for a node touching exactly two of the nodes outside the matched cell (for instance the nodes d, e, and f in FIG. 4).

In this embodiment, no weight is specified for nodes touching three or more matched cell connections because, in that case, the matched cell only covers a single node, and no weighting is necessary. For alternate embodiments in which nodes can be in contact with more than three other nodes, a weight would be specified for nodes touching more than two nodes outside the matched cell.

Figure 6:
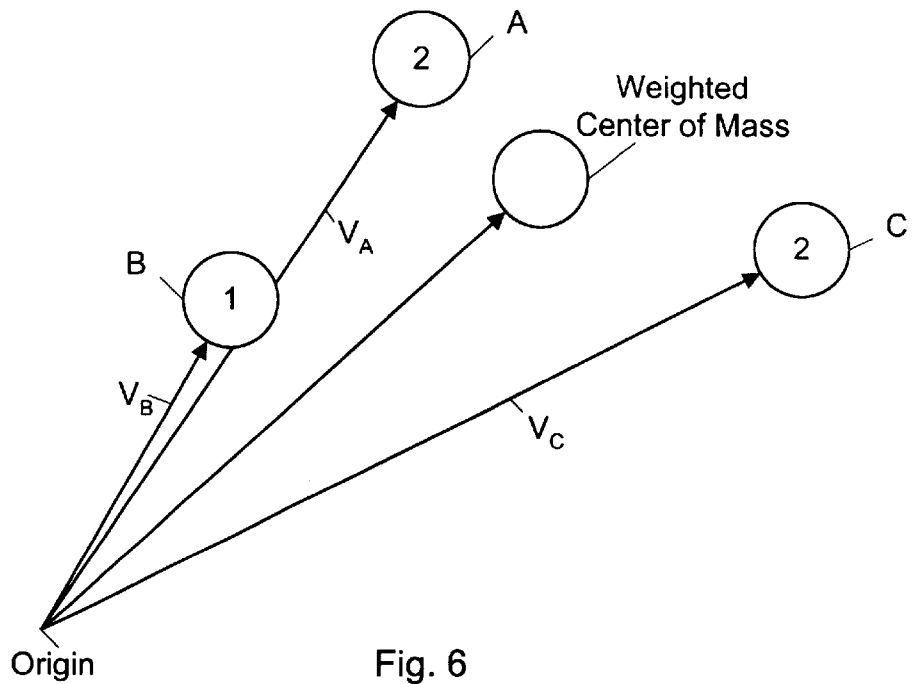
FIG. 6 illustrates the weighted center of mass method.

The matched cell is then placed in the center of mass of the weighted nodes making up the match. Those nodes with a weight of 2 will exert twice the influence of nodes with a weight of 1. Those nodes with a weight of 0 will not exert any influence. FIG. 6 illustrates the implementation of a weighted center of mass calculation. First, a reference coordinate point is determined, such as point o. Then, for each weighted node (a, b, and c), a two-dimensional vector ($v_a$, $v_b$, and $v_c$) from reference point o to the node is calculated. The number on each node of FIG. 6 shows the weight on that node.

The magnitude of each vector ($v_a$, $v_b$, and $v_c$) is multiplied by the weight of the associated node, and the multiplied vectors are summed. The magnitude of the summed vector is then divided by the sum of all node weights, yielding a vector V pointing to the weighted center of mass of the nodes.

This method has the advantage that interconnections are accounted for without requiring information about the position of the nodes driving and driven by the matched cell. It also has the advantage that it is relatively easy to implement. Note that in other embodiments, the weight values in the cases of one or two touched cell connections could be set to values other than 1 and 2.

Figure 7:
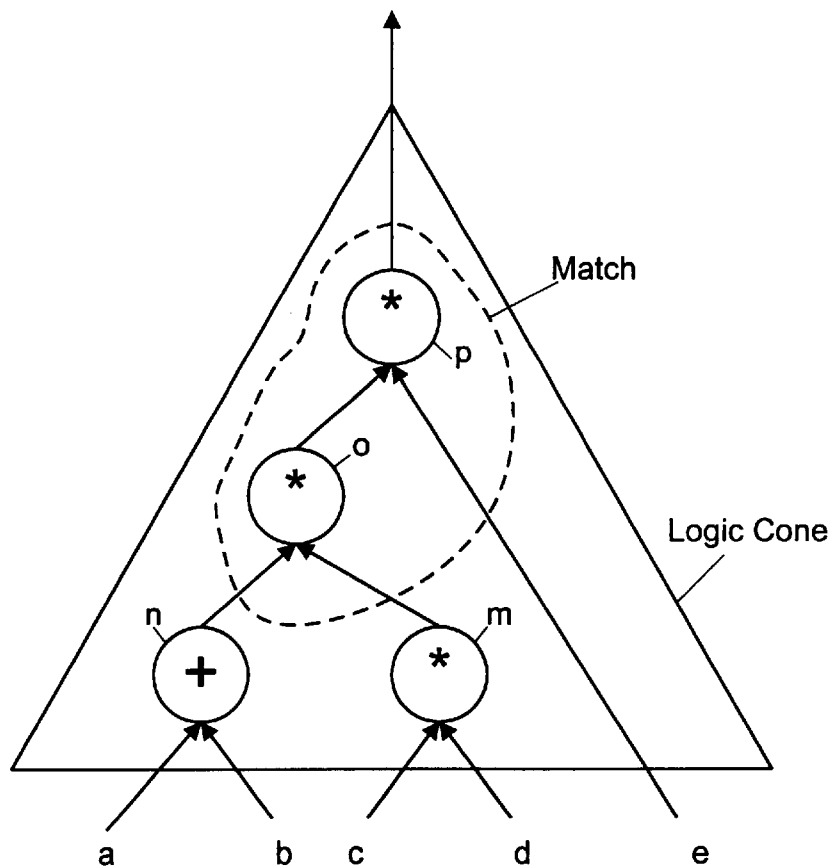
FIG. 7 illustrates the relationship between a match and child nodes of the match.

After the location of the matched cell has been estimated, the pin-to-pin timing performance of each child cover of the match is estimated 408. In the general case, there will be nodes which are not part of the match, but which are child nodes of nodes which are part of the match. As illustrated in FIG. 7, nodes n and m are considered child nodes of the match. If there are such child nodes, they will have been visited by the technology mapper prior to the current node, and a set of K covers will have been determined for each of these match child nodes. In order to calculate the pin-to-pin timing performance of each child cover of the match, it is necessary to know where the match will be located, because the distance from the child cover to the match affect the capacitance, and therefore the timing, of the connection between them. Because the match location has been estimated 406, the timing performance for each cover of each child node of the match can be estimated directly. In order to avoid recomputing the timing performance too many times, the timing performance for each cover can be cached with the capacitance load which was used, so that if any future estimations of the timing performance for the cover have a similar capacitance, the timing performance can be read out of the cache.

From these match cover timing performances, a timing performance matrix is determined 410. A timing performance matrix P is defined as an N by K matrix where each element $P_{ij}$ is the timing performance of the match due to the $j^{th}$ cover of the $i^{th}$ child node of the match. These performances are computed by propagating the child node cover timing performance on the match timing arc from the child node to the match output node. As used here, a timing arc is a path from an input to the match to the output of the match. The performances of each row of matrix P corresponding to a single child node are ordered from best to worst, as illustrated in FIG. 8a. A sorted list of covers for the current node is constructed from worst to best. As indicated above, each cover will incorporate not only a particular match, but also a particular cover for each child node of that match. The worst cover for the current match will be the one using the child node covers in the column of matrix P which corresponds to the worst timing performances. In FIG. 8a, this is the far right column, which is made up of timings 3, 4, 9, 7, and 6 ns. The slowest of these timings, 9 ns, is the timing performance for the cover utilizing these child node covers. This cover is constructed 412 by combining the current match with each of the specified covers for the child nodes. A test is performed 414 to determine whether there are already at least K covers within a predefined performance range, $\Delta$, and whether the current cover is outside of $\Delta$. In one embodiment of the invention, it is preferable to find K covers within a range $\Delta$ of an "ideal" performance time. Such an ideal performance time can be obtained from doing a Zero Slack Algorithm (ZSA) or Iterative Minimax-PERT (IMP) computation. The ZSA and IMP algorithms are described in Youssef, Habib, et al., "Bounds on Net Delays for VLSI Circuits", IEEE Transactions on Circuits and Systems, Vol. 39, No. 11, November 1992, which is incorporated by reference herein in its entirety. The IMP algorithm distributes slack as a function of weights specified on gate timing arcs. In the context of this embodiment, these weights can be automatically generated as a function of the flexibility of the logic cone of which the gate is a part.

Performance timings which are much slower than the ideal will result in unmet timing performance criteria. Performance timings which are much faster than the ideal will often result in non-optimum timing and area tradeoffs. After K covers within $\Delta$ have been identified, it is no longer necessary to consider covers which are not in $\Delta$. In one embodiment of the invention, $\Delta$ is equal to K times $\tau$. If both of these tests are true, then there are no more covers from the current match for the cover list, and the end of the loop for the current match 422 has been reached. Otherwise, another test is performed 416 to determine whether the current cover is inferior to another cover in the list. A cover can be considered inferior, for example, if it has slower timing than another cover and it has an area which is at least as large as that other cover. At this stage, other criteria can be applied to determine whether the cover should be retained. For example, if the cover violates any logic design rules, or if the cover creates placement problems, the cover should be rejected as though it were inferior. If the current cover is not rejected, then the cover is added 418 to the list of covers for this match.

After adding the cover 418 (in the case of non-rejected covers), or after determining 416 that a cover is inferior, matrix P is adjusted 420 to remove the current cover. Each instance of the current timing performance, in this case the 9 ns timing performance, is eliminated from matrix P and each such row is shifted to the right, as in FIG. 8b. The new right-hand column corresponds to a different cover, with a better timing performance, in this case 8 ns. A new cover is constructed 412 for tis column, and the process is repeated until at least one row has been entirely eliminated, in this case after the 4 ns cover has been added to the sorted list.

At this point the current match is complete 422, and execution continues with the next match 404. This process is continued, adding covers to the cover list for the current node, until all matches have been exhausted.

At this point the cover list is complete. The K covers which are closest to the ideal performance timing are retained 424, and the other covers are deleted. In one embodiment, K is 3 and $\Delta$ is computed to be $K*\tau$, where $\tau$ is half of the pin-to-pin delay timing of the fastest inverter in the cell library.

After determining the final list of K covers for the current node, the end of the node loop 426 is reached and execution continues with the next node 400. After all nodes have been covered, the last node visited, the "root node" will have K individual covers, each implying a particular match for each node of the tree. The optimum root node cover is selected, for example, by determining which is closest to the ideal timing performance for the entire tree. This root node cover includes all of the information necessary to determine which match is appropriate for each node of the tree.

The above description is included to illustrate the operation of exemplary embodiments and is not meant to limit the scope of the invention. The scope of the invention is to be limited only by the following claims. From the above description, many variations will be apparent to one skilled in the art that would yet be encompassed by the spirit and scope of the present invention.

What is claimed is:

1. A method of determining a set of K covers for a node, wherein a cover comprises a match and a cover for each child node of the match, the node has at least one match associated with it, each match is associated with at least one child node, each child node has a set of covers associated with it, and the node has a desired timing performance associated with it, the method comprising the steps of:

initializing a list of covers associated with the node;

for each match associated with the node:

creating at least one cover based on the match and based on at least one cover of each child node of the match;

comparing the created cover to at least one retention criterion; and responsive to the comparison indicating that the created cover should be retained, adding the created cover to the list of covers associated with the node; and selecting K covers from the list of covers.

2. The method of claim 1 wherein the step of selecting K covers from the list of covers comprises selecting from the list of covers the K covers with timing performances nearest to the desired timing performance.

3. The method of claim 1 wherein the step of selecting K covers from the list of covers comprises the substeps of:

determining a range of timing performances centered around the desired timing performance;

dividing the range into K segments; and for each segment, selecting from the list of covers one cover with a timing performance within the segment.

4. The method of claim 1 wherein the desired timing performance is based on results from performing an Iterative Minimax-PERT analysis of a logic cone which includes the node.

5. The method of claim 1 wherein the desired timing performance is based on results from performing Zero Slack Algorithm analysis of a logic cone which includes the node.

6. The method of claim 1 wherein at least one retention criterion is whether the created cover is inferior to any covers in the list of covers.

7. The method of claim 1 wherein at least one retention criterion is whether the created cover violates any logic design rules.

8. The method of claim 1 wherein at least one retention criterion is the extent to which the created cover creates a placement problem.

9. The method of claim 1 wherein the set of covers associated with each child node includes K covers.

10. A method of determining a set of K covers for a node, wherein a cover comprises a match and a cover for each child node of the match, the node has at least one match associated with it, each match is associated with at least one child node, each child node has a set of covers associated with it, and the node has a desired timing performance associated with it, the method comprising the steps of:

initializing a list of covers associated with the node;

for each match associated with the node:

creating at least one cover based on the match and based on at least one cover of each child node of the match; and adding the created cover to the list of covers associated with the node; and selecting from the list of covers the K covers with timing performances nearest to the desired timing performance.

11. A system for determining a set of K covers for a node, wherein a cover comprises a match and a cover for each child node of the match, the node has at least one match associated with it, each match is associated with at least one child node, each child node has a set of covers associated with it, and the node has a desired timing performance associated with it, the system comprising:

means for initializing a list of covers associated with the node;

for each match associated with the node:

means for creating at least one cover based on the match and based on at least one cover of each child node of the match;

means for comparing the created cover to at least one retention criterion; and means for, responsive to the comparison indicating that the created cover should be retained, adding the created cover to the list of covers associated with the node; and means for selecting K covers from the list of covers.

12. The system of claim 11 wherein the means for selecting K covers from the list of covers comprises means for selecting from the list of covers the K covers with timing performances nearest to the desired timing performance.

13. The system of claim 11 wherein the means for selecting K covers from the list of covers comprises:

means for determining a range of timing performances centered around the desired timing performance;

means for dividing the range into K segments; and for each segment, means for selecting from the list of covers one cover with a timing performance within the segment.

14. The system of claim 11 wherein at least one retention criterion is whether the created cover is inferior to any covers in the list of covers.

15. The system of claim 11 wherein at least one retention criterion is to whether the created cover violates any logic design rules.

16. The system of claim 11 wherein at least one retention criterion is the extent to which the created cover creates a placement problem.

17. A computer readable medium containing a computer program for determining a set of K covers for a node, wherein a cover comprises a match and a cover for each child node of the match, the node has at least one match associated with it, each match is associated with at least one child node, each child node has a set of covers associated with it, and the node has a desired timing performance associated with it, the computer program, when executed by a processor, performing the steps of:

initializing a list of covers associated with the node;

for each match associated with the node:

creating at least one cover based on the match and based on at least one cover of each child node of the match;

comparing the created cover to at least one retention criterion; and responsive to the comparison indicating that the created cover should be retained, adding the created cover to the list of covers associated with the node; and selecting K covers from the list of covers.

18. The computer readable medium of claim 17 wherein the step of selecting K covers from the list of covers comprises selecting from the list of covers the K covers with timing performances nearest to the desired timing performance.

19. The computer readable medium of claim 17 wherein the step of selecting K covers from the list of covers comprises the substeps of:

determining a range of timing performances centered around the desired timing performance;

dividing the range into K segments; and for each segment, selecting from the list of covers one cover with a timing performance within the segment.

20. The computer readable medium of claim 17 wherein at least one retention criterion is whether the created cover is inferior to any covers in the list of covers.

21. The computer readable medium of claim 17 wherein at least one retention criterion is whether the created cover violates any logic design rules.

22. The computer readable medium of claim 17 wherein at least one retention criterion is the extent to which the created cover creates a placement problem.

\* \* \* \* \*

UNITED STATES PATENT AND TRADEMARK OFFICE
CERTIFICATE OF CORRECTION

PATENT NO.    : 6,378,116 B1
DATED         : April 23, 2002
INVENTOR(S)   : Arnold Ginetti It is certified that error appears in the above-identified patent and that said Letters Patent is hereby corrected as shown below:

<u>Title page,</u>
Item [56], in the reference of the article by Lou, Jinan et al., please replace "Florw" with -- Flow --.

Signed and Sealed this

Sixteenth Day of July, 2002

Attest:

Attesting Officer

JAMES E. ROGAN
*Director of the United States Patent and Trademark Office*